US009640369B2

(12) United States Patent
Wadley et al.

(10) Patent No.: US 9,640,369 B2
(45) Date of Patent: May 2, 2017

(54) COAXIAL HOLLOW CATHODE PLASMA ASSISTED DIRECTED VAPOR DEPOSITION AND RELATED METHOD THEREOF

(75) Inventors: Haydn N. G. Wadley, Keswick, VA (US); Goesta Mattausch, Ullersdorf (DE); Henry Morgner, Dresden (DE); Frank-Holm Roegner, Dresden (DE)

(73) Assignee: University of Virginia Patent Foundation, Charlottesville, VA (US)

( * ) Notice: Subject to any disclaimer, the term of this patent is extended or adjusted under 35 U.S.C. 154(b) by 784 days.

(21) Appl. No.: 13/202,828

(22) PCT Filed: Feb. 24, 2010

(86) PCT No.: PCT/US2010/025259
§ 371 (c)(1),
(2), (4) Date: Sep. 12, 2011

(87) PCT Pub. No.: WO2010/099218
PCT Pub. Date: Sep. 2, 2010

(65) Prior Publication Data
US 2011/0318498 A1    Dec. 29, 2011

Related U.S. Application Data

(60) Provisional application No. 61/154,890, filed on Feb. 24, 2009, provisional application No. 61/248,082, filed on Oct. 2, 2009.

(51) Int. Cl.
*C23C 16/00*    (2006.01)
*H01J 37/32*    (2006.01)
(Continued)

(52) U.S. Cl.
CPC ...... *H01J 37/32596* (2013.01); *C23C 14/228* (2013.01); *C23C 14/246* (2013.01);
(Continued)

(58) Field of Classification Search
CPC .................................................. H01J 37/32596
(Continued)

(56) References Cited

U.S. PATENT DOCUMENTS 3,381,157 A * 4/1968 Ferreira ..................... 313/348
3,569,661 A   3/1971 Ebeling
(Continued)

FOREIGN PATENT DOCUMENTS

WO    WO 98/01596    1/1998
WO    WO 99/65626    12/1999
(Continued)

OTHER PUBLICATIONS

Asmann et al., "Characterization of the Converging Jet Region in a Triple Torch Plasma Reactor", Plasma Chemistry and Plasma Processing, Mar. 2001, pp. 37-63, vol. 21, No. 1.
(Continued)

*Primary Examiner* — Keath Chen
(74) *Attorney, Agent, or Firm* — Robert J. Decker

(57) ABSTRACT

A plasma generation process that is more optimized for vapor deposition processes in general, and particularly for directed vapor deposition processing. The features of such an approach enables a robust and reliable coaxial plasma capability in which the plasma jet is coaxial with the vapor plume, rather than the orthogonal configuration creating the previous disadvantages. In this way, the previous deformation of the vapor gas jet by the work gas stream of the hollow cathode pipe can be avoided and the carrier gas consumption needed for shaping the vapor plume can be significantly decreased.

36 Claims, 8 Drawing Sheets

(51) Int. Cl.
  C23C 14/22    (2006.01)
  C23C 14/24    (2006.01)
  C23C 14/30    (2006.01)
  C23C 14/32    (2006.01)
  H01J 37/305   (2006.01)
  H01J 37/34    (2006.01)

(52) U.S. Cl.
  CPC ............. *C23C 14/30* (2013.01); *C23C 14/32* (2013.01); *H01J 37/3053* (2013.01); *H01J 37/3233* (2013.01); *H01J 37/32055* (2013.01); *H01J 37/32357* (2013.01); *H01J 37/32449* (2013.01); *H01J 37/32568* (2013.01); *H01J 37/34* (2013.01)

(58) Field of Classification Search
  USPC .................................................. 118/726, 727
  See application file for complete search history.

(56) References Cited

U.S. PATENT DOCUMENTS

| | | | |
|---|---|---|---|
| 3,612,937 | A | 10/1971 | Smirnov |
| 4,380,078 | A | 4/1983 | Wang |
| 4,407,712 | A * | 10/1983 | Henshaw et al. ........ 204/298.05 |
| 4,812,040 | A | 3/1989 | Marcus et al. |
| 5,457,298 | A * | 10/1995 | Nelson et al. .......... 219/121.52 |
| 5,534,314 | A | 7/1996 | Wadley |
| 5,635,087 | A | 6/1997 | Schiller |
| 5,736,073 | A | 4/1998 | Wadley |
| 5,846,608 | A * | 12/1998 | Neumann et al. ............ 427/529 |
| 6,103,074 | A | 8/2000 | Khominich |
| 6,215,091 | B1 * | 4/2001 | Chung et al. ........... 219/121.48 |
| 6,478,931 | B1 | 11/2002 | Wadley |
| 7,014,889 | B2 | 3/2006 | Groves |
| 7,211,348 | B2 | 5/2007 | Wadley |
| 7,401,643 | B2 | 7/2008 | Queheillalt |
| 7,718,222 | B2 | 5/2010 | Hass |
| 7,879,411 | B2 | 2/2011 | Hass |
| 8,084,086 | B2 | 12/2011 | Hass |
| 8,110,143 | B2 | 2/2012 | Rabiei |
| 8,124,178 | B2 | 2/2012 | Hass |
| 8,784,512 | B2 | 7/2014 | Wadley |
| 2001/0002284 | A1 * | 5/2001 | Kohler et al. ................. 427/488 |
| 2002/0163289 | A1 | 11/2002 | Kaufman |
| 2003/0054133 | A1 | 3/2003 | Wadley |
| 2004/0118347 | A1 * | 6/2004 | Groves et al. .......... 118/723 EB |
| 2004/0168635 | A1 | 9/2004 | Neumann |
| 2004/0217713 | A1 | 11/2004 | Madocks |
| 2005/0000444 | A1 | 1/2005 | Hass |
| 2005/0266163 | A1 | 12/2005 | Wortman |
| 2005/0287296 | A1 * | 12/2005 | Wadley et al. ............. 427/248.1 |
| 2006/0062912 | A1 | 3/2006 | Wortman |
| 2007/0017636 | A1 * | 1/2007 | Goto ...................... B82Y 30/00 156/345.47 |
| 2007/0181417 | A1 | 8/2007 | Chistyakov |
| 2008/0131611 | A1 | 6/2008 | Hass |
| 2008/0135212 | A1 | 6/2008 | Queheillalt |

FOREIGN PATENT DOCUMENTS

| | | |
|---|---|---|
| WO | WO 01/90438 | 11/2001 |
| WO | WO 02/06747 | 1/2002 |
| WO | WO 02/15300 | 2/2002 |
| WO | WO 02/087787 | 11/2002 |
| WO | WO 03/028428 | 4/2003 |
| WO | WO 03/091473 | 11/2003 |
| WO | WO 2004/011688 | 2/2004 |
| WO | WO 2004/043691 | 5/2004 |
| WO | WO 2004/048632 | 6/2004 |
| WO | WO 2005/047202 | 5/2005 |
| WO | WO 2005/089107 | 9/2005 |
| WO | WO 2007/005832 | 1/2007 |
| WO | WO 2009/023744 | 2/2009 |

OTHER PUBLICATIONS

Bhattacharyya et al., "Modeling of Heterogeneous Systems in a Plasma Jet Reactor", AICheE Journal, Sep. 1975, pp. 879-885, vol. 21, Issue 5.
Borom et al., "Role of Environmental Deposits and Operating Surface Temperature in Spallation of Air Plasma Sprayed Thermal Barrier Coatings", Surface & Coatings Technology, 1996, pp. 116-126, vol. 86-87.
Dalal et al., "Properties of a-Si:H Films Grown Using Hot Wire-ECR Plasma Techniques", Thin Solid Films, Apr. 2003, pp. 91-94, vol. 430, Issues 1-2.
Ding et al., "PVD NiAl Intermetallic Coatings: Microstructure and Mechanical Properties", Surface & Coatings Technology, 1997, pp. 483-489, vol. 94-95.
Evans, "Perspective on the Development of High-Toughness Ceramics", Journal of the American Ceramic Society, Feb. 1990, pp. 187-206, vol. 73, No. 2.
Fairbanks et al., "The Durability and Performance of Coatings in Gas Turbine and Diesel Engines", Materials Science and Engineering, 1987, pp. 321-330, vol. 88.
Ferreira et al., "Theory of the Hollow Cathode Arc", Journal of Applied Physics, Apr. 1, 1978, pp. 2380-2395. vol. 49, No. 4.
Godbole et al., "Aluminum Nitride Buffer Layer for Diamond Film Growth", Journal of Materials Research, 1996, pp. 1810-1818, vol. 11, No. 7.
Godbole et al., "Deposition of Wear-Resistant AlN-Diamond Composite Coatings", Materials Science and Engineering: B, 1996, pp. 153-159, vol. 39, Issue 3.
Godbole et al., "Diamond Films and Composites on Cobalt-Chromium Alloys", Materials Science and Engineering: B, Mar. 1999, pp. 251-257, vol. 58, Issue 3.
Godbole et al., "Nucleation and Growth of Diamond Films on Aluminum Nitride Coated Nickel", Applied Physics Letters, Aug. 1995, pp. 1322-1324, vol. 67, Issue 9.
Groves et al., "Directed Vapor Deposition of Amorphous and Polycrystalline Electronic Materials: Nonhydrogenated a-Si", Journal of Electrochemical Society, Oct. 1995, pp. L173-L175, vol. 142, No. 10.
Groves et al., "Directed Vapour Deposition", Surface Engineering, 2000, pp. 461-464, vol. 16, No. 6.
Gundel et al., "Experimental and Theoretical Assessment of the Longitudinal Tensile Strength of Unidirectional SiC-Fiber/Titanium-Matnx Composites", Composites Science and Technology, 1997, pp. 471-481, vol. 57, No. 4.
Hass et al., "Physical Vapor Deposition on Cylindrical Substrates", Surface & Coatings Technology, 2004, pp. 283-291, vol. 185.
Hass, "Thermal Barrier Coatings via Directed Vapor Deposition", Ph.D. Dissertation, 2001, 286 pages, University of Virginia.
Jagannadham, "Model of Interfacial Thermal Resistance of Diamond Composites", Journal of Vacuum Science & Technology A, 1999, pp. 373-379, vol. 17, No. 2.
Jin et al., "Lithium Manganese Oxide Films Fabricated by Electron Beam Directed Vapor Deposition", Journal of Vacuum Science & Technology A, 2008, pp. 114-122, vol. 26, No. 1.
Kim et al., "Plasma-Assisted Deposition of Lithium Phosphorus Oxynitride Films: Substrate Bias Effects", Journal of Power Sources, 2009, pp. 591-598, vol. 187, No. 2.
Kuo et al., "Hot Hollow Cathode and its Applications in Vacuum Coating: A Concise Review", Journal of Vacuum Science & Technology A, 1986, pp. 397-402, vol. 4, No. 3.
Lee, "A Method of Solving the Moving Boundary Heat Transfer Problem in Plasma Sprayed Particles", Journal of Physics D: Applied Physics, 1990, pp. 12-17, vol. 23, No. 1.
Lee, "Current Status of Environmental Barrier Coatings for Si-Based Ceramics", Surface & Coatings Technology, 2000, pp. 1-7, vol. 133-134.
Lee, "Heat Transfer of Particles in Plasma Flow", Journal of Physics D: Applied Physics, 1988, pp. 73-78, vol. 21, No. 1.
Lewis et al., "Motion of Particles Entrained in a Plasma Jet", AIChE Journal, 1973, pp. 982-990, vol. 19, No. 5.

(56) References Cited

OTHER PUBLICATIONS

Louh et al., "Fabrication of Barium Titanate Ferroelectric Layers by Electrophoretic Deposition Technique", Materials Chemistry and Physics, 2003, pp. 226-229, vol. 79, Issues 2-3.

Mevrel et al., "Pack Cementation Processes", Materials Science and Technology, 1986, pp. 201-206, vol. 2, Issue 3.

Oliver et al., "An Improved Technique for Determining Hardness and Elastic Modulus using Load and Displacement Sensing Indentation Experiments", Journal of Materials Research, Jun. 1992, pp. 1564-1583, vol. 7, Issue 6.

Quan et al., "Low-Energy Ion-Assisted Control of Interfacial Structures in Metallic Multilayers", Journal of Crystal Growth, 2007, pp. 431-439, vol. 300, No. 2.

Quan et al., "Low Energy Ion Assisted Atomic Assembly of Metallic Superlattices", Surface Science, 2006, pp. 2275-2287, vol. 600, Issue 11.

Rahmane et al., "Analysis of the Enthalpy Probe Technique for Thermal Plasma Diagnostics", Review of Scientific Instruments, 1995, pp. 3424-3461, vol. 66, No. 6.

Schulz et al., "Two-Source Jumping Beam Evaporation for Advanced EB-PVD TBC Systems", Surface & Coatings Technology, 2000, pp. 40-48, vol. 133-134.

Suresha et al., "Toughening Through Multilayering in TiN—AlTiN Films", Philosophical Magazine, Jun. 2007, pp. 2521-2539, vol. 87, No. 17.

Tolpygo et al., "Oxidation-Induced Failure of EB-PVD Thermal Barrier Coatings", Surface & Coatings Technology, 2001, pp. 124-131, vol. 146-147.

Varacalle et al., "Titanium Carbide Coatings Fabricated by the Vacuum Plasma Spraying Process", Surface & Coatings Technology, 1996, pp. 70-74, vol. 86-87.

Weber et al., "Materials and Concepts for Solid Oxide Fuel Cells (SOFCs) in Stationary and Mobile Applications", Journal of Power Sources, Mar. 2004, pp. 273-283, vol. 127, Issues 1-2.

Yamamoto, "Solid Oxide Fuel Cells: Fundamental Aspects and Prospects", Electrochimica Acta, 2000, pp. 2423, vol. 45, Issues 15-16.

Yoshida et al., "Particle Heating in a Radio-Frequency Plasma Torch", Journal of Applied Physics, Jun. 1, 1977, pp. 2252-2260, vol. 48, No. 6.

Zhang et al., "Diamond Growth on Steel Substrates with Al—N Interlayer Produced by High Power Plasma Streams", Thin Solid Films, 1999, pp. 162-164, vol. 349.

Zhou et al., "Atomistic Simulations of the Vapor Deposition of Ni/Cu/Ni Multilayers: The Effects of Adatom Incident Energy", Journal of Applied Physics Aug. 15, 1998, pp. 2301-2315, vol. 84, No. 4.

Zhou et al., "The Low Energy Ion Assisted Control of Interfacial Structure: Ion Incident Energy Effects", Journal of Applied Physics, Jun. 15, 2000, pp. 8487-8496, vol. 87, No. 12.

Zhou et al., "Hyperthermal Vapor Deposition of Copper: Athermal and Biased Diffusion Effects", Surface Science, 1999, pp. 42-57, vol. 431, Issue 1-3.

Zhou et al., "Hyperthermal Vapor Deposition of Copper: Reflection and Resputtering Effects", Surface Science, 1999, pp. 58-73, vol. 431, Issue 1-3.

\* cited by examiner

COAXIAL HOLLOW CATHODE PLASMA ASSISTED DIRECTED VAPOR DEPOSITION AND RELATED METHOD THEREOF

RELATED APPLICATIONS

This application is a national stage filing of International Application No. PCT/US2010/025259, filed Feb. 24, 2010, which claims priority under 35 U.S.C. §119(e) to U.S. Provisional Application Ser. No. 61/154,890, filed Feb. 24, 2009, entitled "Coaxial Hollow Cathode Plasma Assisted Directed Vapor Deposition and Related Method Thereof and U.S. Provisional Application Ser. No. 61/248,082, filed Oct. 2, 2009, entitled "Coaxial Hollow Cathode Plasma Assisted Directed Vapor Deposition and Related Method Thereof" the disclosures of which are hereby incorporated by reference herein in their entirety.

BACKGROUND OF THE INVENTION

Coatings applied by physical vapor deposition (PVD) processes—typically performed in a vacuum—are widely used in various applications such as in creating barrier layers for packaging films, metalizing plastics for flexible electronics and EMI shielding purposes, depositing scratch-proof, corrosion protection or decorative layers on various raw materials, or for controlling the electrical, optical and tribological properties of components, tools and machine parts. Usually, different techniques may be capable of depositing the desired layers, but business economics favor processes which create the coatings quickly and efficiently. This means, the process must be able to generate large amounts of vapor rapidly, and to transport and deposit it to the substrate with low losses and at the right atomic scale structures needed for the given application.

Electron beams are established as a known tool for evaporating materials at highly achievable rates. For coating of large-area substrates, like plastic or metal films and sheets, extended evaporators heated by scanned high-power electron beams are available. It is well known that deposition rates ranging up to 10 μm/s can be achieved with this technology, i.e. the rates are several orders of magnitude higher than with sputter technology. Without applying additional aids, however, the layers grown at high rates are usually of poor quality.

Another drawback of conventional thermal evaporators—the fairly low utilization of the evaporant material when coating smaller substrates such as tools, engine parts or fibers—stems from the inherently divergent propagation characteristic of the vapor particles.

To address these issues, the development of a new coating technology, which is now called "Directed Vapor Deposition" (DVD) was started several years ago. The basic idea of the DVD concept is to evaporate the coating material by an electron beam and then to capture, transport and focus the vapor particles by a flowing carrier gas stream. This approach, fully described and disclosed in the U.S. Pat. No. 5,534,314 (of which is hereby incorporated by reference), combines the advantages of conventional EB evaporation (high vaporization rate, clean and uncontaminated material evaporation, easy alloy deposition by co-evaporation of the pure constituents from individual crucibles) with the advantages of known jet evaporators (high material utilization efficiency, possibility to vary adatom energy and spatial distribution of the vapor stream, natural mixing of vapor and reactive gas components).

In a number of applications, such as coating of fibers and metal foams, or formation of "zig-zag" structured thermal barrier coatings (TBC's) for jet engines, the DVD process demonstrated unique capabilities (non-line-of-sight coating, vapor utilization efficiency) beyond those known from established PVD technologies. However, it was also found in the course of investigations that DVD at this stage was restricted to deposition of porous or columnar microstructures. As in conventional EB-PVD, this is caused by the limited kinetic energy of the thermally generated vapor atoms. In the case of TBC's, a columnar structure is desired by the engineering purpose. For other applications or also for certain layers in the multilayer systems required in turbine blade coating, however, dense structures are demanded.

Extensive development work previously done in conventional PVD has shown that this goal can be achieved by combining the thermal evaporation process with a plasma activation of the vapor. The plasma facilitates that a remarkable fraction of the neutral vapor particles will get ionized. The ions can then be accelerated towards the substrate by the electrical fields within the plasma sheath between the bulk plasma and the substrate's surface. These fields are generally caused by the intrinsic self-bias potential of the plasma but may also be enforced by an external bias voltage. The enhanced kinetic energy of condensing particles results in densification and improved adherence of the deposited layers. By changing the plasma density, a wide range of layer modifications can be created. Further, the plasma promotes the chemical activity of reactive gases involved in deposition of compounds.

Calculations and experiments have revealed that only arc sources deliver plasma, which is sufficiently dense and capable of efficiently ionizing the vapor flux prevalent in high-rate coating. For instance, an apparatus for plasma-assisted high-rate coating has been described in the U.S. Pat. No. 5,635,087 (of which is hereby incorporated by reference). It combines electron beam evaporation with a plasma activation utilizing a transverse hollow cathode arc discharge. The process appeared to be well suited even for reactive deposition of insulating layers (oxides, nitrides) onto cold plastic substrates.

This approach has been adopted for creating a plasma-activation tool for the DVD process, too. Details of this innovation have been fully described and disclosed in the U.S. Pat. No. 7,014,889 (of which is hereby incorporated by reference). The plasma-activated DVD process has proven to be capable of high-efficient deposition and precise control of deposited coatings' composition and morphology in a great variety of applications including coatings of aircraft engine components and semiconductor wafers, among other items. In aircraft applications, coatings can be applied for both thermal and environmental barriers, as well as oxidation and hot corrosion mitigation coatings. Directed vapor deposition methods are also used to apply titanium alloy coatings to silicon carbide monofilaments to make titanium matrix composites, and to infiltrate silicon carbide fiber performs with SiC to make (SiC/SiC) ceramic matrix composites. The use of plasmas also greatly enhances vapor phase reaction rates enabling the synthesis of hard materials such as titanium carbide and various nitrides.

The conventional plasma assisted deposition process has several drawbacks, however. First, the plasma source's working gas emitted from the hollow cathode forms a high speed jet whose axis is at right angles to the direction of vapor transport. Slow moving or light (i.e. low momentum) vapor particles can be scattered away from the substrate by the working gas jet of the hollow cathode. Second, the conventional approach requires the use of high argon working gas flow rates which has adverse economic consequences. It also requires a more powerful vapor transporting gas jet which has economic consequences because of the greater use of the helium gas and need for higher capacity pumping systems. Third, there is no means for sweeping the vapor plume from side to side (i.e. paint spraying a large area surface) in the conventional arrangement without significantly effecting the plasma properties. Fourth, the conventional plasma generation approach provides inadequate cleaning, etching, and heating properties for some applications (i.e. the deposition of high temperature materials onto large area substrates).

SUMMARY OF THE INVENTION

An embodiment of the present invention provides, among other things, a plasma generation process that is more optimized for vapor deposition processes in general, and particularly for directed vapor deposition processing. An embodiment of the present invention provides, among other things, the process of plasma generation that is stable across a very wide range of background pressures and in coexistence with the supersonic gas-vapor-jet. An embodiment of the present invention is applicable to, among other things, a very wide range of source materials and operates in the presence of many different gases (both reactive and nonreactive) including, but not limited to, inert gases, and inert gases doped with nitrogen, methane, borane, etc.

In addition to these features, an embodiment of the present invention provides, among other things, the approach that enables a robust and reliable coaxial plasma capability in which the plasma generating discharge is coaxial with the vapor plume, rather than the orthogonal configuration creating the previous disadvantages. In this way, the previous deformation of the vapor gas jet by the work gas stream of the hollow cathode pipe is avoided and the carrier gas consumption needed for shaping the vapor plume is significantly decreased. Second, instead of only one large hollow cathode pipe or slot, an annular arrangement of many small pipes can be used. Individual control of working gas flow and current for each pipe will enable the desired sweeping of the plasma plume in sync with the vapor jet. Third, some of the design variants described herein will contain means for magnetic tuning of the discharge. This is aimed at further increasing the particle energy as well as optimizing the spatial density distribution. Fourth, the components of the new plasma system can be designed with enhanced electric insulating capability up to the kV range. This will allow for biasing the plasma source with respect to the chamber (and/or substrate) and hence, performing heating or etching steps conveniently.

An aspect of an embodiment of the present invention provides an apparatus for applying at least one coating onto at least one substrate. The apparatus may comprise: a deposition chamber; at least one evaporant source, at least one energetic beam for impinging the evaporant source; at least one hollow cathode aligned at least substantially coaxially with the evaporant source for delivering a discharge current; at least one plasma-forming gas emitted from the hollow cathode; and at least one anode for electrostatically attracting the discharge current from the hollow cathode.

An aspect of an embodiment of the present invention provides a method for depositing at least one evaporant onto at least one substrate. The method may comprise: providing at least one substrate; providing at least one evaporant source impinging the at least one evaporant source with an energetic beam; discharging a current that is aligned with the evaporant source; emitting a plasma forming gas that is at least substantially aligned with the evaporant source; electrostatically attracting the discharge current; and interacting the plasma with the substrate.

An aspect of an embodiment of the present invention provides a method or apparatus for depositing at least one evaporant onto at least one substrate. The method may comprise (or the apparatus may be configured for) the following: providing at least one substrate; providing at least one evaporant source; impinging the at least one evaporant source with an energetic beam, providing a plasma source and discharging a current that is at least substantially coaxially aligned with the evaporant source; emitting a plasma forming gas that is at least substantially coaxially aligned with the evaporant source; electrostatically attracting the discharge current; and interacting the plasma with the substrate.

An aspect of an embodiment of the present invention provides a method or apparatus for depositing at least one evaporant onto at least one substrate. The method may comprise (or the apparatus may be configured for) the following: providing at least one substrate; providing at least one evaporant source; impinging the at least one evaporant source with an energetic beam to generate a vapor plume; generating a plasma and discharging a current that is aligned with said vapor plume; emitting the generated plasma that is at least substantially aligned with the vapor plume; electrostatically attracting the discharge current; and interacting the plasma with the substrate. Further, the discharge current may be changed as desired to modulate and/or control the plasma density.

An aspect of an embodiment of the present invention provides a method or apparatus for depositing at least one evaporant onto at least one substrate. The method may comprise (or the apparatus may be configured for) the following: providing at least one substrate; providing at least one evaporant source; impinging the at least one evaporant source with an energetic beam to generate a vapor plume; generating a plasma and discharging a current that is aligned with the vapor plume; emitting at least one plasma forming gas in a direction that is at least substantially aligned with the vapor plume; electrostatically attracting the discharge current towards at least one anode; and interacting the plasma with the substrate.

These and other objects, along with advantages and features of various aspects of embodiments of the invention disclosed herein, will be made more apparent from the description, drawings and claims that follow.

BRIEF DESCRIPTION OF THE DRAWINGS

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

DETAILED DESCRIPTION OF THE INVENTION

Figure 1:
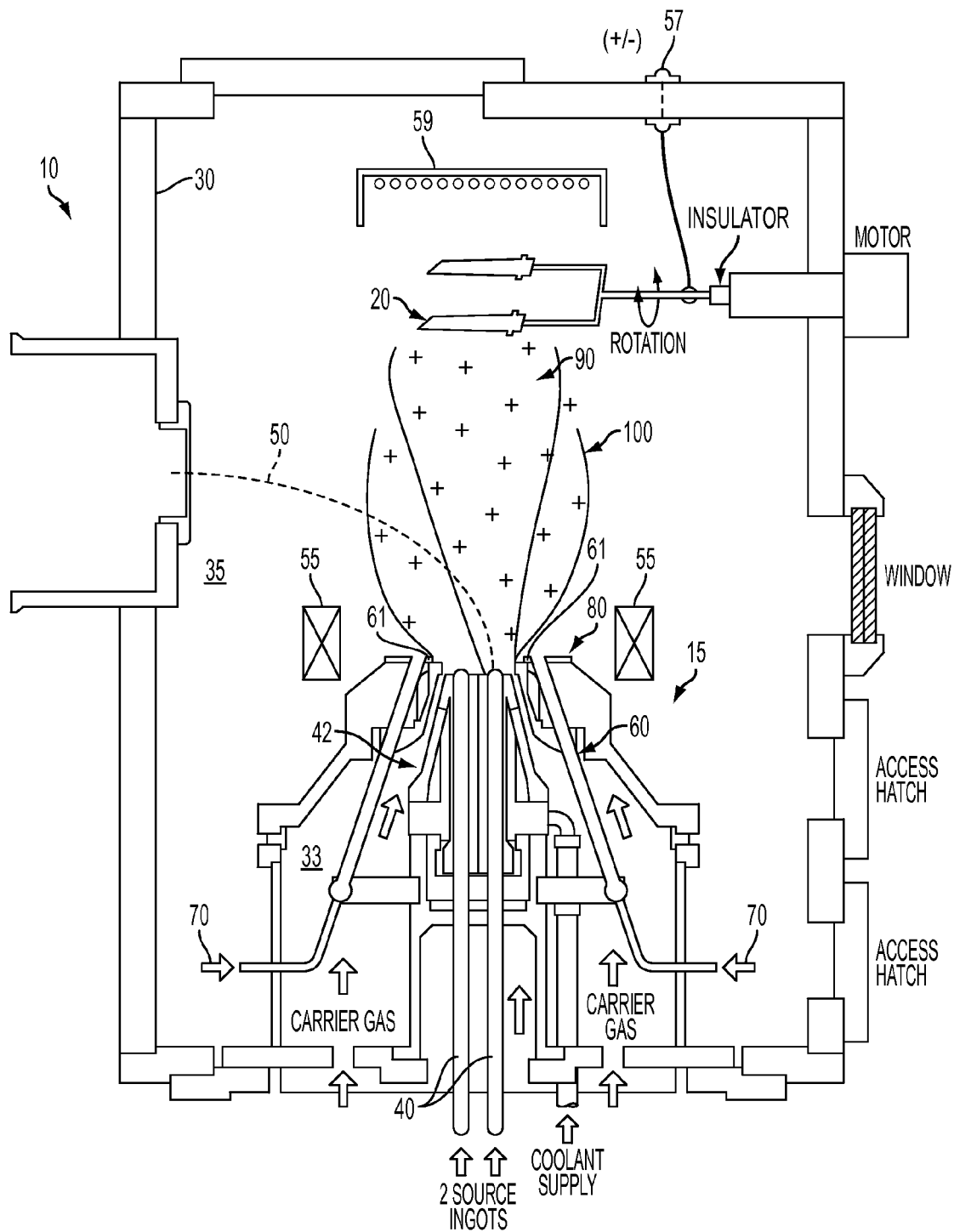
FIG. 1 is a longitudinal sectional schematic view of an embodiment of the coaxial vapor deposition apparatus and assembly.
Figure 2:
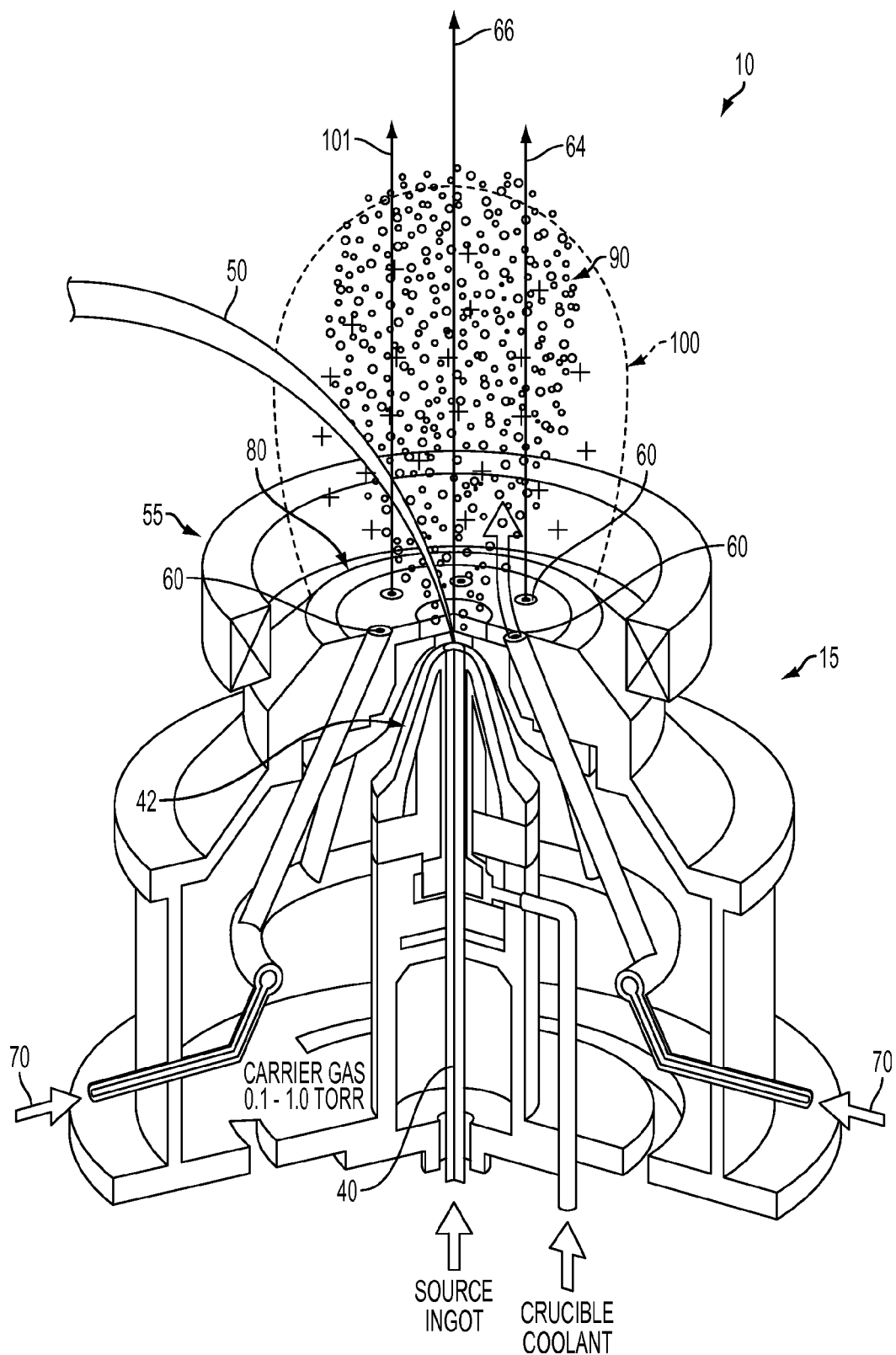
FIG. 2 is a sectional schematic view of an embodiment of the evaporation and plasma generation aspect of the plasma deposition system.

Turning now to the drawings, an aspect of an embodiment of the present invention, as shown in FIGS. 1-2, is a method and apparatus 10 for applying at least one coating onto at least one substrate 20 (e.g., sample), utilizing a plasma assisted directed vapor deposition process. The apparatus 10 may include a deposition chamber 30, having an upstream area 33, and downstream area 35, at least one evaporant source 40, at least one energetic beam 50 for impinging the evaporant source 40, at least one hollow cathode 60 aligned at least substantially coaxially with the evaporant source 40 for delivering a discharge current (not shown), at least one plasma-forming gas 70 (e.g., working gas) emitted from the hollow cathode 60, and at least one anode 80 for electrostatically attracting the discharge current from the hollow cathode 60. At least some of the elements included in the apparatus 10 may comprise a "nozzle" 15, which may participate in applying at least one coating to at least one substrate 20.

The energetic beam 50 may be produced by an electron beam gun, a laser source, or any other device now or later appreciated in the art. In the case of an electron beam gun, it may be operated in either a low vacuum state, or at a reduced background pressure (i.e. a high vacuum state). The electron beam gun may be approximately a 70 kV/10 kW type, but not necessarily.

The anode 80 may be ring-shaped or annular, and may be placed in an elevated position above the hollow cathode 60, which may be inside a downstream chamber area 35 from the nozzle 15. This positioning may prevent the anode 80 from being coated by vapor from the vapor plume 90. Additionally, the anode 80 may be positioned at an inclined angle, facing away from the vapor plume 90, which may advantageously prevent contamination from the vapor plume 90. Additionally, the elevated positioning of the anode 80 may advantageously aid in attracting plasma in the direction of the substrate 20, thus enhancing the overall efficiency of the vapor deposition process.

A vapor plume 90 may be created by evaporation, via the energetic beam 50, of a source material (the evaporant source) 40 which may be contained in a cooling device 42 for cooling the evaporant source 40. The cooling device 42 may be a crucible, or any other means now known or later appreciated in the art. While the evaporant source 40 may generally be a solid, it should be appreciated that it could also be in the form of a liquid. As a solid, the evaporant source 40 may turn locally into a liquid upon impingement of the energetic beam 50. Then, vaporization may occur from a resulting "melt pool" (not shown). Some solid materials may be vaporized by sublimation directly (i.e. without forming a melt pool), and may not require a cooling device 42. Possible modifications to the evaporant source 40 may include wires, bars, granulates, or any other modification now known or later appreciated. In a case where more than one evaporant source 40 may be used, the evaporant source 40 may consist of different materials in order to deposit compounds onto the substrate 20 via "co-evaporation." Additionally, multiple evaporant sources 40 may also exist if necessary.

Still observing FIGS. 1-2, the hollow cathode 60 may be designed as the source of plasma, and may be designed to operate in a high-current, low voltage arc mode and may be additionally designed to emit electrons forming a low-voltage electron beam (also known as the "cathode effect"). The cathode effect may be created by arranging two or more hollow cathodes 60 substantially coaxially around at least one evaporant source 40. In other words, one or more evaporant sources 40 may be substantially coaxially integrated inside the perimeter outlined by the two or more hollow cathodes 60. The two or more hollow cathodes may be positioned in an annular configuration around at least one evaporant source. For example, the annular configuration may be any desired array. It should be appreciated that the hollow cathodes may be a variety of structures, including, but not limited to any one of the followings: pipes, conduits, tubes, channels, hose, stems, ducts, ports, grooves, passages, tunnels, ports, or the like as desired.

Figure 8:
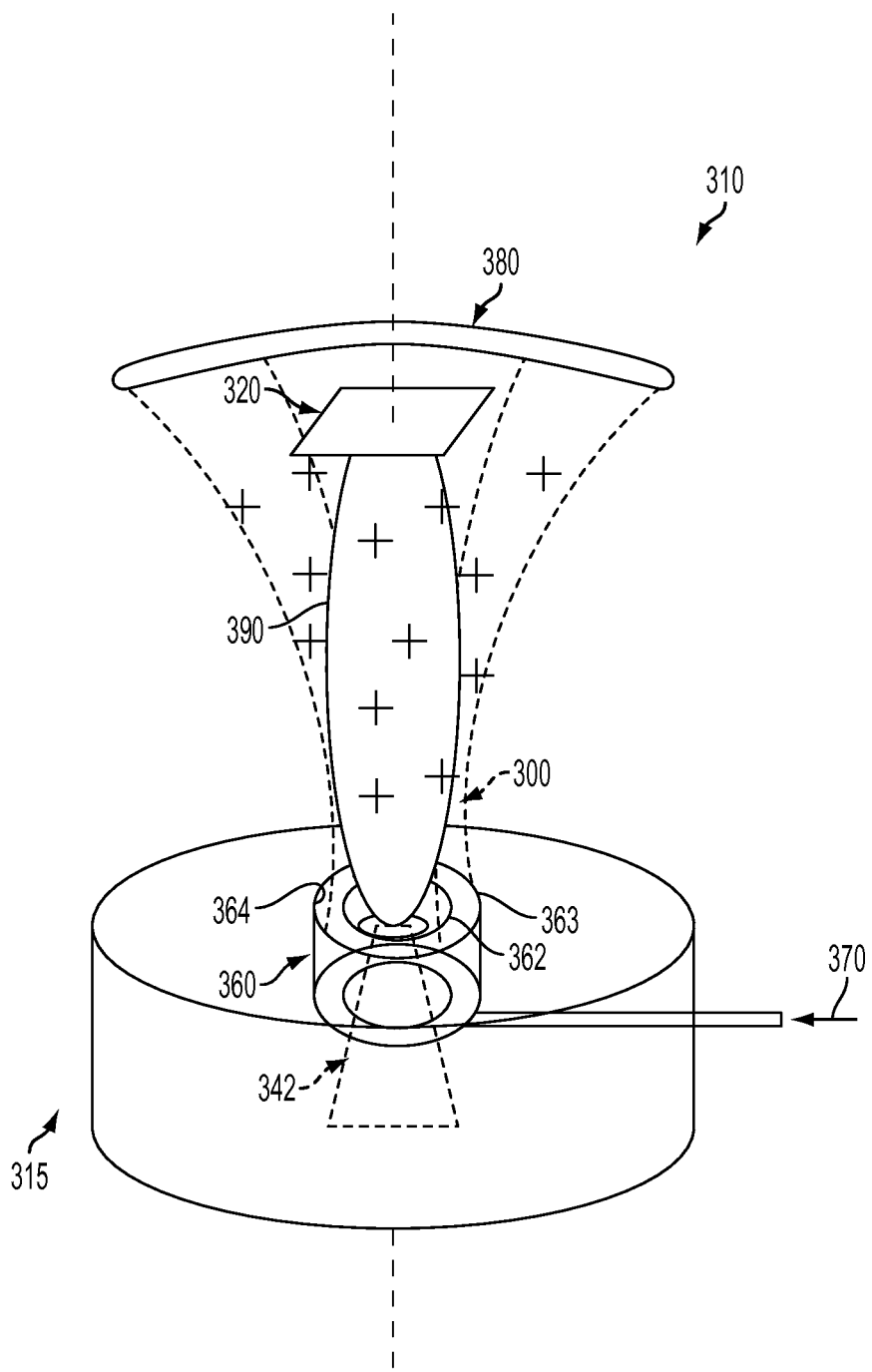
FIG. 8 is a sectional schematic view of an embodiment where the anode is positioned above the substrate.

In an embodiment (not shown), the hollow cathode 60 and its cathode effect in the present invention may be realized by positioning two coaxial cylinders, an inner cylinder (not shown), and outer cylinder (not shown) of slightly different diameters to form a continuous annular slot (not shown) from which a plasma jet 100 could be emitted. One or more evaporant sources 40 may be substantially coaxially integrated inside the inner cylinder (not shown). For example, referring to an embodiment as shown in FIG. 8, which is an alternative to FIG. 3 (discussed below), it should be appreciated that such an approach may be applied to any of the embodiments disclosed or referenced herein. Still referring to FIG. 8, the hollow cathode 360 and its cathode effect in an embodiment of the resent invention ma realized by positioning two coaxial cylinders, an inner cylinder 362, and outer cylinder 363 of slightly different diameters to form there between a continuous annular slot 364 from which a plasma jet 300 could be emitted. One or more evaporant sources (not shown) may be substantially coaxially integrated inside the inner cylinder 362.

The plasma forming gas 70, when emitted from the hollow cathode 60, may form a plasma jet 100 (e.g., plasma region), which may stream off of the hollow cathode's orifice 61. The axis 101 and/or momentum of the plasma jet 100 as well as the axis and/or momentum of the hollow cathode's low voltage electron beam (not shown) may be at least substantially aligned with the axis 64 of the hollow cathode 60. When the hollow cathode 60 and corresponding axis 64 are aligned with the evaporant-source-to-substrate vector 66, the plasma jet 100 may at least partially assist the axisymmetric entrainment and transport of the vapor plume 90 to the substrate 20, which may allow for the total gas that must be pumped in the system (for high efficiency deposition) to be significantly reduced. As discussed above, the plasma jet 100 may at least partially entrain the vapor plume 90 and may at least partially assist in transporting the vapor plume 90 towards the substrate 20. The plasma jet 100 may also partially shape the vapor plume 90. At least some of the vapor plume 90 may be ionized by the plasma jet 100 and by the hollow cathode's low voltage electron beam (not shown).

An aspect of an embodiment of the present invention may also include a bias voltage 57 applied to the substrate 20. By applying a bias voltage 57 to the substrate 20, plasma particles from the vapor plume 90 can be accelerated toward the substrate 20 to enhance or perform various kinds of beneficial interactions with the substrate 20. The bias voltage 57 may be DC, AC, unipolar or bipolar pulsed voltage, or any other means now known or later appreciated in the art.

A negative potential difference between the substrate 20 and the plasma bulk will accelerate ions towards the substrate 20. During a vapor deposition process and with the bias voltage 57 in the range of approximately 0 V to approximately 250 V, one can increase the mean energy of condensing particles aimed at improved adhesion and quality (as measured, e.g., by packing factor, density, degree of crystallinity) of the grown layer (plasma activated deposition). When applied prior to a physical vapor deposition (PVD), for example, coating process in a suitable gas atmosphere (mostly Ar at approximately 0.5 Pa, for example) and with the bias voltage 57 in the range of approximately 500 to approximately 1000 V, sputtering occurs and removes impurities or adsorbed layers thus cleaning the substrate surface (ion etching). With specific parameter combinations, however, it is also possible to embed (reactive) gaseous species into near-surface layers of the substrate thus forming special interfaces for subsequent coating (ion implantation).

If the substrate 20 is positively biased, plasma electrons may be accelerated toward the substrate 20, providing a power source for advantageous heating of the substrate 20.

The apparatus 10 may also comprise a means for initiating the emission of a plasma jet 100 from the hollow cathode's orifice 61. The means may comprise a heat source based on Ohmic heating of a current conductor, a heat source based on an auxiliary gas discharge, a "kicker" circuit to ignite the hollow cathode plasma emission via a high voltage impulse, or any other means now known or later appreciated.

The desired arc discharge from the hollow cathode 60 may be significantly sustained by thermionic and thermally-assisted field emission of electrons from the hollow cathode 60. These means for initiating plasma emission may require a high work temperature of the hollow cathode 60 which may be established first to enable the operation in arc mode afterwards. Initial heating of the cathode may be achieved by resistive heating of the hollow cathode 60 itself or of an auxiliary radiation heater (not shown).

Alternatively, the hollow cathode 60 may be heated slowly by a glow discharge which may burn at voltages comparable to or slightly higher than the later arc mode voltage. Glow discharge may require high plasma gas flows or an elevated pressure within the deposition chamber 30 during the ignition phase.

Alternatively, the arc discharge from the hollow cathode 60 may also be initiated via a glow discharge heating phase at a later desired gas flow and chamber pressure. There, the discharge may be ignited by applying a voltage significantly higher (kV range) than the final burning voltage in the arc mode. After ignition, the transition to the low-voltage arc mode may occur rapidly. In that situation, the high voltage usually may be provided as a short impulse. This procedure may generally be referred to as a "kicker" circuit. In that situation, after ignition, the cathode temperature may be maintained by the arc discharge itself, and the additional means for heating may be turned off.

Figure 6:
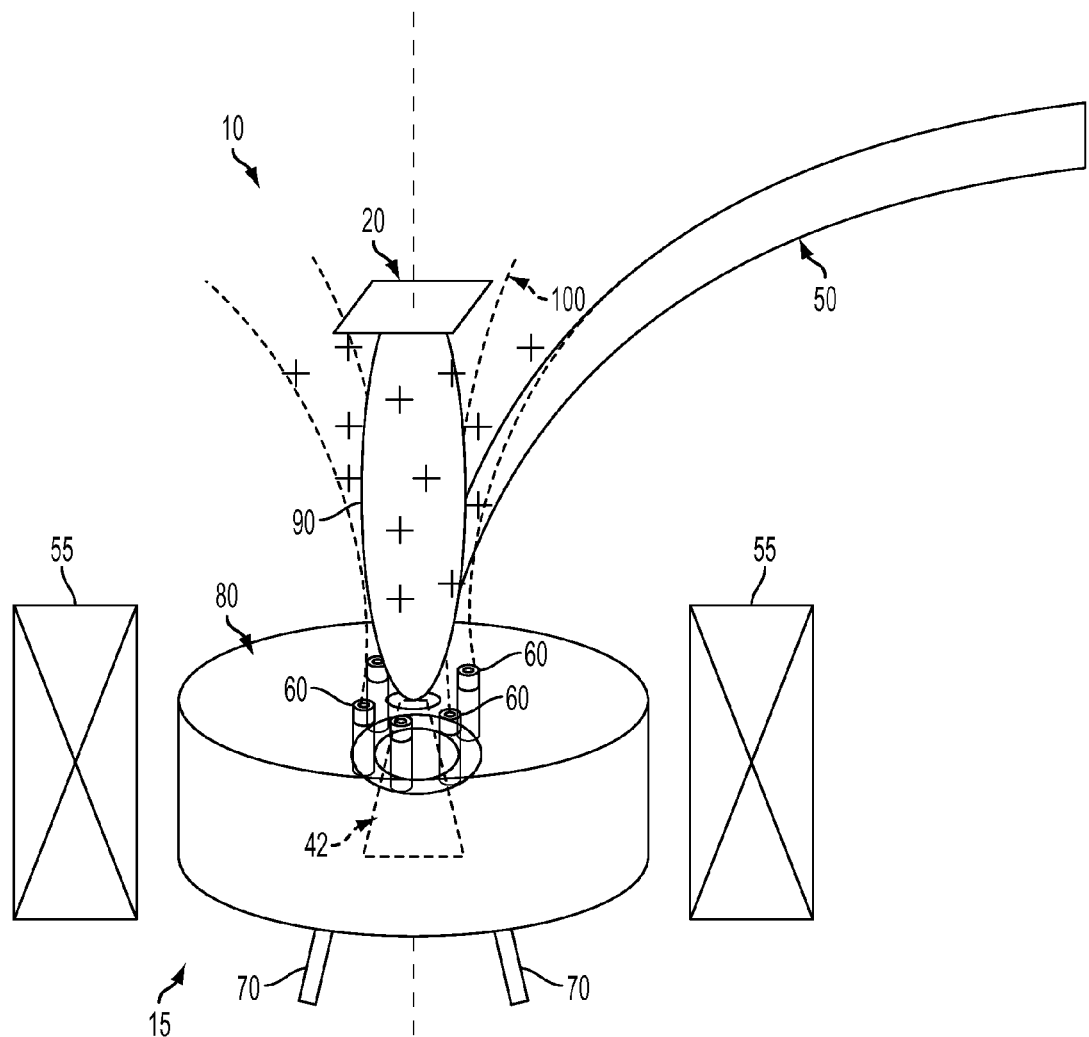
FIG. 6 is a sectional schematic view of an embodiment where individual gas lines to each hollow cathode pipe are shown and a coil is used for magnetic enhancement of the plasma.

As shown in FIGS. 1, 2 and 6, the apparatus 10 may further comprise a solenoid 55 (e.g., solenoid coil) positioned coaxially and at least partially proximal to the at least one hollow cathode 60. The solenoid 55 may be capable of at least partially bending the energetic beam 50, and most effectively if the energetic beam is, for example, an electron beam. The solenoid 55 may be positioned and energized such as to magnetically enhance the efficiency of the hollow cathode 60. Additionally, the solenoid 55 may at least partially increase plasma density and facilitate an axial potential gradient for accelerating positive ions of the plasma jet 100, or the vapor plume 90, or both toward the substrate 20. The solenoid 55 may also provide the ability to alter the beam impingement points for the energetic beam 50 among one or more evaporant sources 40. The use of a solenoid coil 55 may allow the evaporation geometry to be changed to advantageously increase the space available for positioning and manipulating complex shaped substrates 20 and auxiliary heating 59 and biasing 57 subsystems. Additionally, the placement of the solenoid 55 near the anode 80 may advantageously enhance the discharge voltage, and hence, the particle energy. An embodiment of the apparatus 10, as shown in FIG. 6, is arranged whereby individual gas lines providing the plasma forming gas 70 (e.g., working gas) to each hollow cathodes 60 are shown and a coil 55 is used for magnetic enhancement of the plasma.

Overall, the use of a solenoid coil 55 at least partially proximal to at least one hollow cathode 60 may allow for an increased ion saturation current at low gas flow through the hollow cathode 60. The use may also provide elevated discharge voltages, and therefore, higher electron temperatures, which is generally advantageous for low-vacuum applications. Additionally, by adjusting the current in the solenoid 55, it may be possible to manipulate not only the ion saturation current, but also the spatial distribution of the ions in the deposition chamber 30.

An aspect of an embodiment of the present invention may also comprise means for the inlet of at least one secondary gas forming at least one jet positioned at least substantially coaxially with said at least one evaporant source and at least one hollow cathode. The at least one secondary gas jets may at least partially assist in shaping and transporting the vapor plume to the substrate. The at least one secondary gas jets may also introduce reactant gases for creating compounds with the evaporated material. Possible embodiments include, but are not limited to, concentric arrangement around the hollow cathode slot/multi jets, multi jet array where plasma and secondary gas jets alternate along a common circle line around the evaporant sources, or slot-type or multi jet gas nozzles integrated into the annular anodes.

Figure 3:
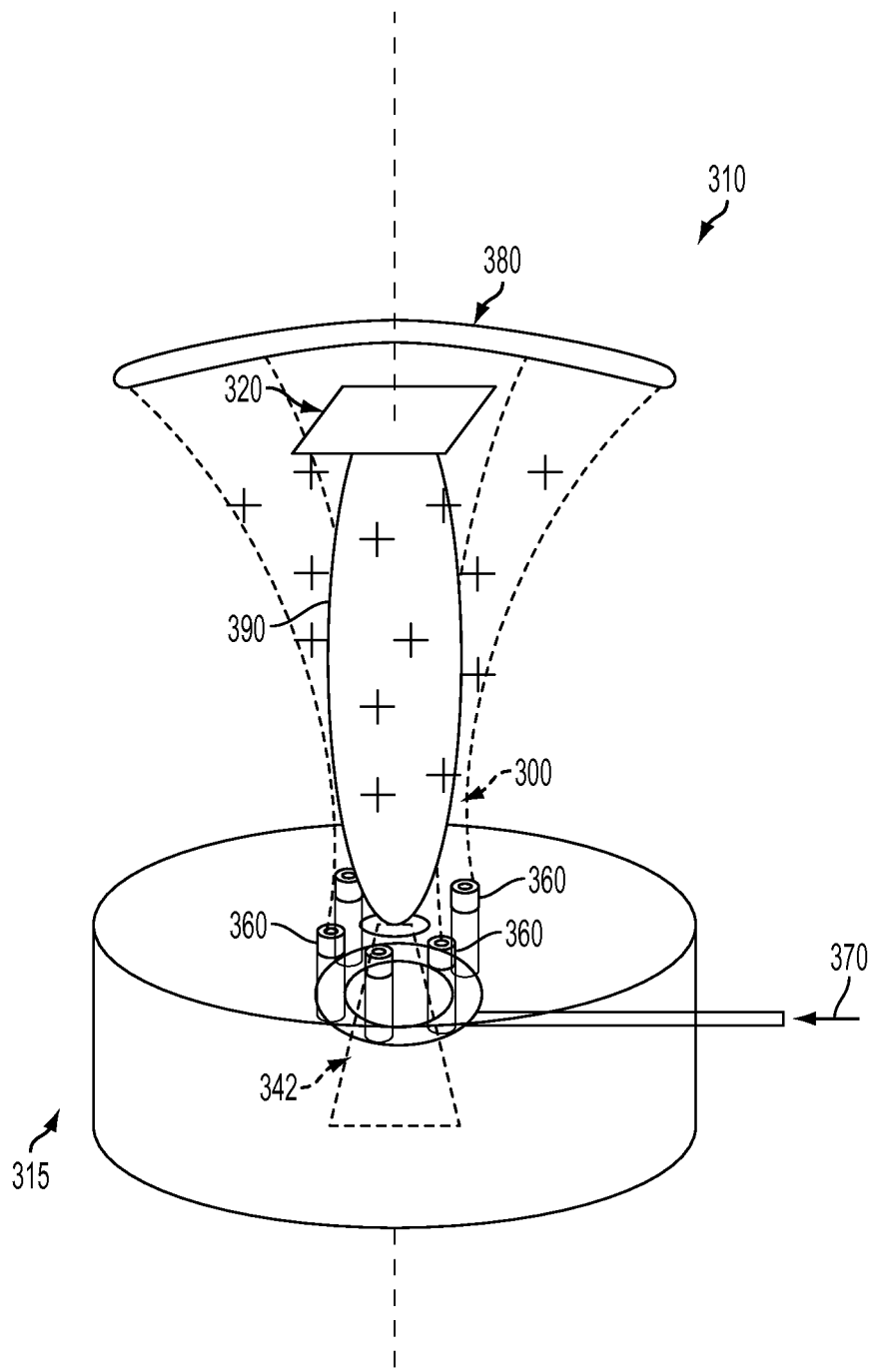
FIG. 3 is a sectional schematic view of an embodiment where the anode is positioned above the substrate.

In an embodiment of the apparatus 310 having a nozzle 315, shown in FIG. 3, the anode 380 may be annular, and may be configured in an elevated position above the at least one hollow cathodes 360. The plasma forming gas 370 (e.g., working gas), when emitted from the hollow cathode 360, may form a plasma jet 300 (e.g., plasma region). A source material (not shown) such as the evaporant source, may be contained in a cooling device 342. Furthermore, the anode 380 may be positioned above the substrate 320 (for example, as shown), or between the substrate 320 and hollow cathode 360 (not shown). This later configuration may allow for the anode 380 to be advantageously shielded from the vapor plume 390 by the substrate 320.

Figure 4:
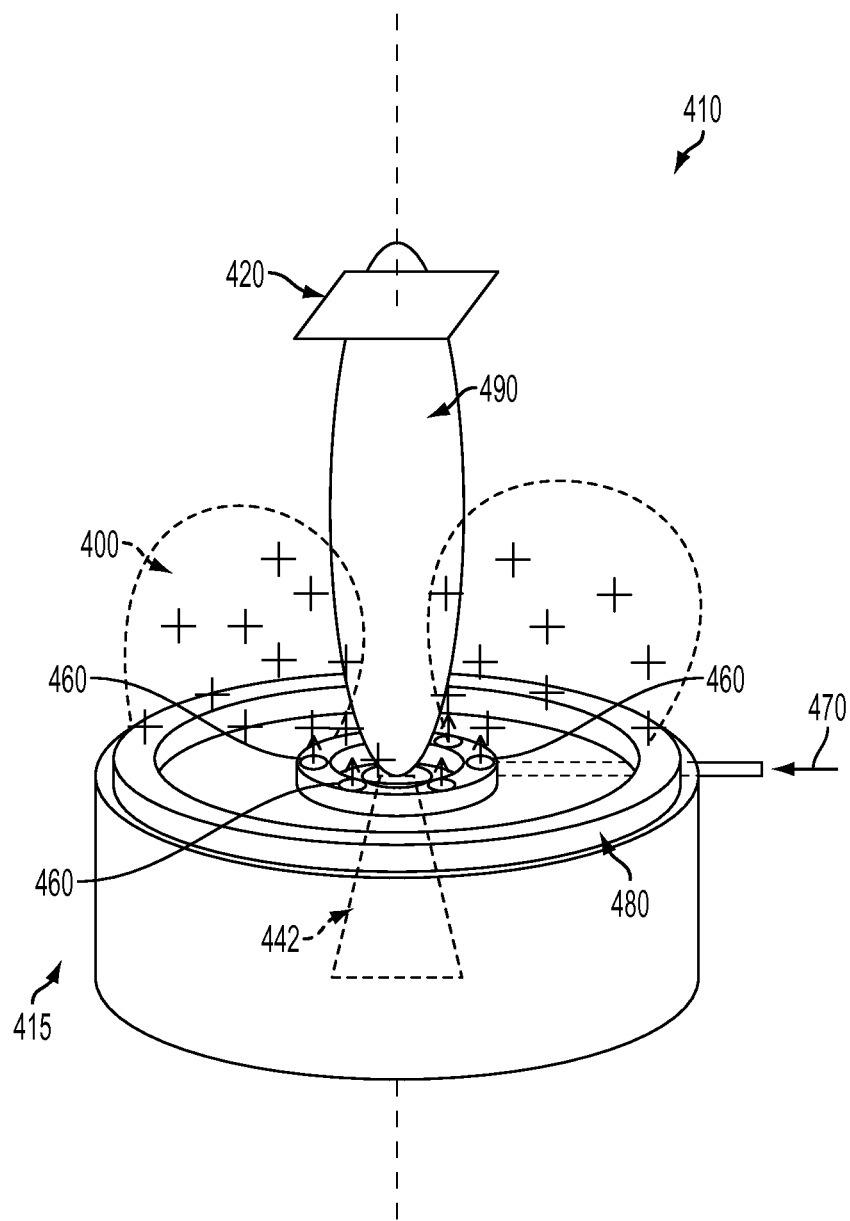
FIG. 4 is a sectional schematic view of an embodiment where the anode is positioned in the plane of the hollow cathode pipe exits into the deposition chamber.
Figure 5:
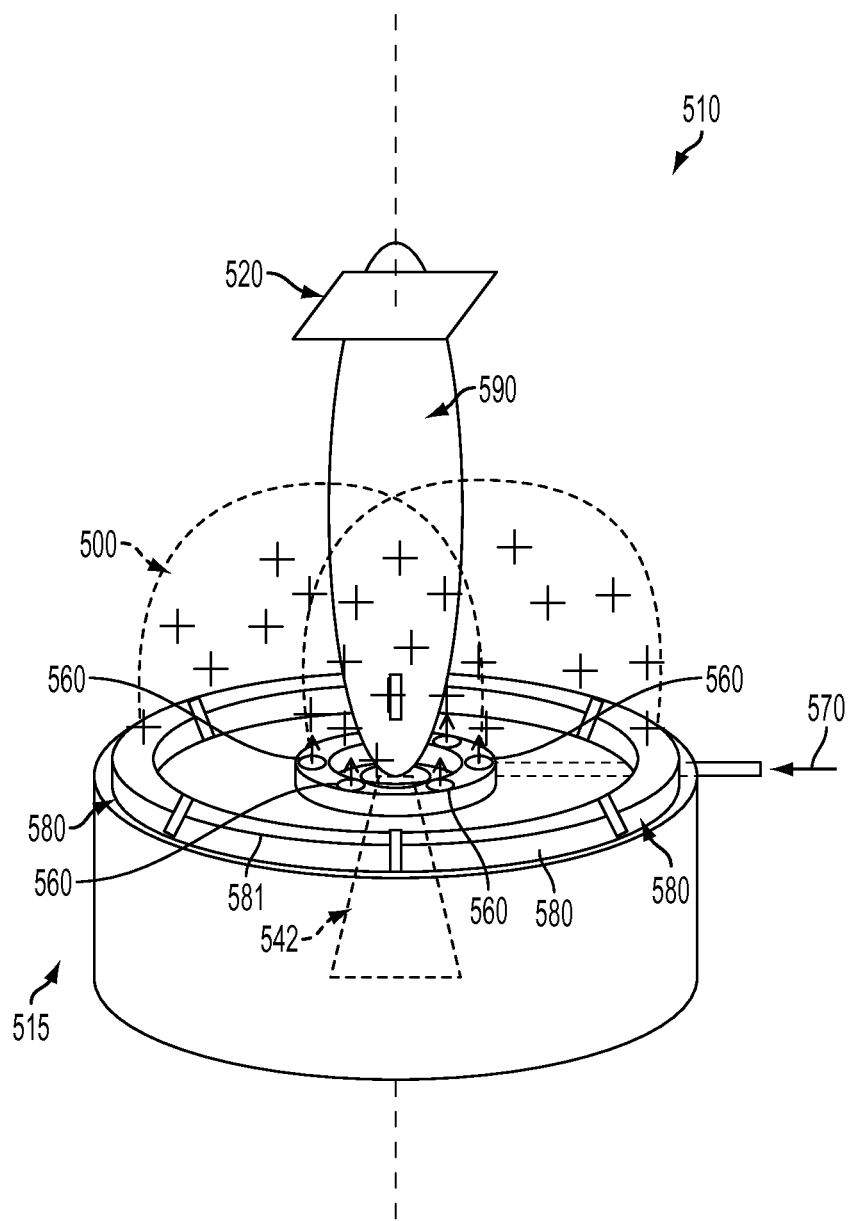
FIG. 5 is a sectional schematic view of an embodiment where the anode is segmented to force individual discharges across the central axis.

In an embodiment of the apparatus 410 having a nozzle 415, shown in FIG. 4, the anode 480 may be annular, and may be positioned at least coaxially and in the same plane as the at least one hollow cathode 460. The plasma forming gas 470 (e.g., working gas), when emitted from the hollow cathode 460, may form a plasma jet 400 (e.g., plasma region). A source material (not show), such as the evaporant source, may be contained in a cooling device 442. Also shown are a substrate 420 and vapor plume 490. Additionally, turning to an embodiment of the apparatus 510, as shown in FIG. 5 for use with a substrate 520, the anode 580 may be bisected radially, forming anode segments 581. The anode 580 may be bisected into the same number (but not necessarily) of anode segments 581 as the number of hollow cathodes 560. This may allow for the emissions from the hollow cathodes 560 to burn diametrically across the vapor plume 590 between each one of the hollow cathodes 560 and the corresponding anode segment 581 situated at the opposite position. This diametric burning may drive the emission of the hollow cathode 560 across the center of the nozzle 515, which may increase the plasma density in regions where the concentration of the vapor plume 590 is the highest. The plasma forming gas 570 (e.g., working gas), when emitted from the hollow cathode 560, may form a plasma jet 500 (e.g., plasma region). A source material (not shown), such as the evaporant source, may be contained in a cooling device 542.

The above configurations may provide the ability to control the relative intensity of the plasma jets 100 generated by the hollow cathodes 60 for optional directional aerodynamic sweeping either of the plasma jet 100, or vapor plume 90, or both, from side to side (i.e. spray coat a large surface area or different areas) without significantly affecting the plasma properties. This directional aerodynamic sweeping may be accomplished by systematically controlling the pressure or gas flow rates individually in each hollow cathode 60, or any other means now known or later appreciated in the art.

Figure 7:
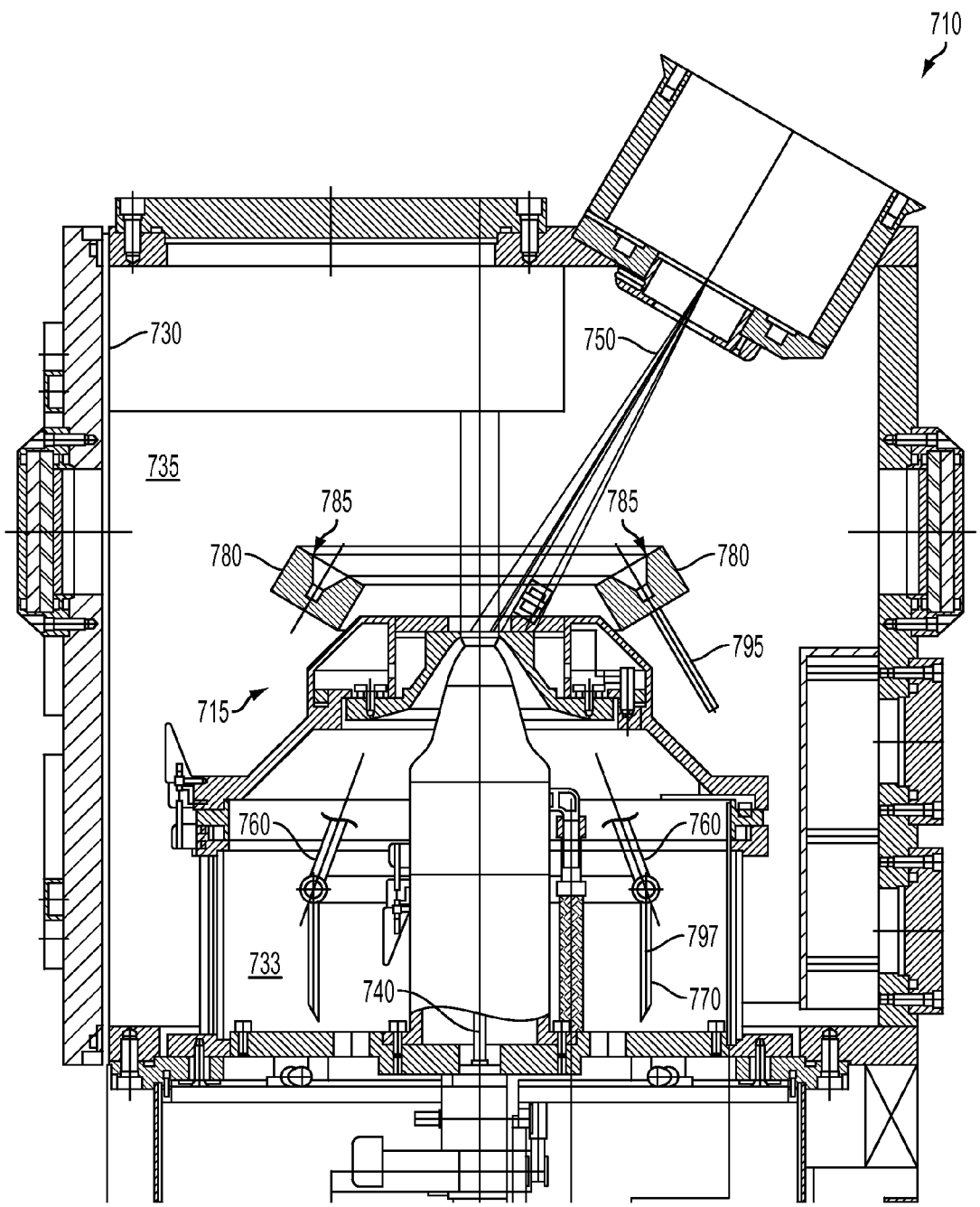
FIG. 7 is a longitudinal schematic cross sectional view of an embodiment of the coaxial vapor deposition apparatus and assembly in a working form.

In an embodiment of the apparatus 710, as shown in FIG. 7, the anode 780 may further comprise a means for magnetic plasma confinement by creating a magnetic field (not shown) and guiding a magnetic flux (not shown) such that the magnetic field lines in front of the anode 780 may be substantially parallel to its surface and radially directed. This is an exemplary embodiment of a working form wherein two or more hollow cathode pipes are positioned in the upstream chamber of a directed vapor deposition apparatus and the annular anode comprises a magnetic circuit facilitating an anodic plasma layer. The described magnetic field arrangement together with the electric field strength directed substantially normal to the surface of the anode 780 may produce a circular Lorentz force parallel to the anode's surface 785 ($F=E\times B$) which may advantageously create a closed circumferential electron drift track. Along this track, intensive ionization of the gas and vapor particles may occur. In the vicinity of the anode 780, the magnetic field (not shown) will diverge and may facilitate via ambipolar diffusion an axial potential gradient for accelerating positive ions toward the substrate (not shown). Furthermore, the use of magnetic plasma confinement may advantageously provide for enhanced discharge voltage resulting in an increase in the mean energy of the discharge electrons to values which are close to the maximum in the energy dependence of the cross section for electron impact ionization. Suitable inclination angle of the anode 780, appropriate shielding (not shown) and use of a clear gas flow (not shown) shall ensure protection against contamination of the anode surface 785 by stray vapor. As discussed previously, this embodiment may include a deposition chamber 730, at least one evaporant source 740, at least one energetic beam 750 for impinging the evaporant source 740, at least one hollow cathode 760 for delivering a discharge current (not shown), and at least one anode 780 for electrostatically attracting the discharge current from the hollow cathode 760. At least some of the elements included in the apparatus 710 may comprise a "nozzle" 715 acting as a flow resistor which pressure-wise separates the upstream area 733 from the downstream area 735, thus facilitating the generation of a directed carrier gas stream as needed for vapor entrainment and for applying at least one coating to at least one substrate 20. The plasma forming gas 770 may be emitted from the hollow cathode 760.

Two or more hollow cathodes 760 of the plasma source may be arranged around the evaporant source 740 as an annular multi jet array and placed below the nozzle 715 inside the upstream area 733. The plasma forming gas 770 streaming off the hollow cathode 760 is released into the upstream area 733 and acts then as a carrier gas for vapor plume shaping upon directed expansion downstream into the deposition chamber 730.

Also provided may be any of the following modules 795: power cable, water cooling, purging gas and coil current. Also provided may be any of the following modules 797: power cable and water cooling.

It should be appreciated that aspects of various embodiments of the present invention system and method may be utilized for applying a large variety of coatings, barriers, layers, films, packaging, or other desired materials, or structures for, but not limited thereto, the following: electronics, optics, engine components, rotors, blades, desired structures or components, packaging films, metalizing plastics for flexible electronics or EMI shielding purposes, nanostructures, for depositing scratch-proof, corrosion protection or decorative layers on various raw materials, for controlling the electrical, optical and tribological properties of components, tools and machine parts, coatings of aircraft (or land or watercraft) engine components and semiconductor wafers, among other items. In aircraft (or sea or land crafts) applications, coatings can be applied for both thermal and environmental barriers. Further, aspects of various embodiments of the present invention system and method may be utilized for: metalizing ceramic or other non-metallic (organic) metal matrix composite reinforcing fibers; coating nanomaterials (particles, rods, wires, and fibers, or the like); and growing nanowires for opto-electric sensors.

The devices, systems, compositions, apparatuses, and methods of various embodiments of the invention disclosed herein may utilize aspects disclosed in the following references, applications, publications and patents and which are hereby incorporated by reference herein in their entirety:

International Patent Application No. PCT/US2008/073071, filed Aug. 13, 2008, entitled "Thin Film Battery Synthesis by Directed Vapor Deposition"; Haydn N. G. Wadley;

U.S. patent application Ser. No. 12/733,160, filed Feb. 16, 2010, entitled "Thin Film Battery Synthesis by Directed Vapor Deposition"; Haydn N. G. Wadley;

International Patent Application No. PCT/US2006/025978, filed Jun. 30, 2006, entitled "Reliant Thermal Barrier Coating System and Related Methods and Apparatus of Making the Same"; Haydn N. G. Wadley;

U.S. patent application Ser. No. 11/917,585, filed Dec. 14, 2007, entitled "Reliant Thermal Barrier Coating System and Related Methods and Apparatus of Making the Same"; Haydn N. G. Wadley;

International Patent Application No. PCT/US2001/022266, filed Jul. 16, 2001, entitled "Method And Apparatus For Heat Exchange Using Hollow Foams and Interconnected Networks and Method of Making the Same"; Haydn N. G. Wadley;

U.S. patent application Ser. No. 10/333,004, filed Jan. 14, 2003, entitled "Heat Exchange Foam"; Haydn N. G. Wadley, U.S. Pat. No. 7,401,643, issued Jul. 22, 2008;

U.S. patent application Ser. No. 11/928,161, filed Oct. 30, 2007, entitled "Method and Apparatus for Heat Exchange Using Hollow Foams and Interconnected Networks and Method of Making the Same"; Haydn N. G. Wadley;

International Patent Application No. PCT/US2005/000606, filed Jan. 10, 2005, entitled "Apparatus and Method for Applying Coatings onto the Interior Surfaces of Components and Related Structures Produced Therefrom"; Haydn N. G. Wadley;

U.S. patent application Ser. No. 10/584,682, filed Jun. 28, 2006, entitled "Apparatus and Method for Applying Coatings onto the Interior Surfaces of Components and Related Structures Produced Therefrom"; Haydn N. G. Wadley;

International Patent Application No. PCT/US2004/024232, filed Jul. 28, 2004, entitled "Method for Application of a Thermal Barrier Coating and Resultant Structure Thereof"; Haydn N. G. Wadley;

U.S. patent application Ser. No. 10/566,316, filed Feb. 14, 2006, entitled "Method for Application of a Thermal Barrier Coating and Resultant Structure Thereof"; Haydn N. G. Wadley;

International Patent Application No. PCT/US2003/037485, filed Nov. 21, 2003, entitled "Bond Coat for a Thermal Barrier Coating System and Related Method Thereof"; Haydn N. G. Wadley;

U.S. patent application Ser. No. 10/535,364, filed May 18, 2005, entitled "Bond Coat for a Thermal Barrier Coating System and Related Method Thereof"; Haydn N. G. Wadley;

International Patent Application No. PCT/US2003/036035, filed Nov. 12, 2003, entitled "Extremely Strain Tolerant Thermal Protection Coating and Related Method and Apparatus Thereof"; Haydn N. G. Wadley;

U.S. patent application Ser. No. 10/533,993, filed May 5, 2005, entitled "Extremely Strain Tolerant Thermal Protection Coating and Related Method and Apparatus Thereof"; Haydn N. G. Wadley;

International Patent Application No. PCT/US2003/023111, filed Jul. 24, 2003, entitled "Method and Apparatus for Dispersion Strengthened Bond Coats for Thermal Barrier Coatings"; Haydn N. G. Wadley;

U.S. patent application Ser. No. 10/522,076, filed Jan. 21, 2005, entitled "Method and Apparatus for Dispersion Strengthened Bond Coats for Thermal Barrier Coatings"; Haydn N. G. Wadley;

International Patent Application No. PCT/US2003/012920, filed Apr. 25, 2003, entitled "Apparatus and Method for Uniform Line of Sight and Non-Line of Sight Coating at High Rate"; Haydn N. G. Wadley;

U.S. patent application Ser. No. 10/512,161, filed Oct. 15, 2004, entitled "Apparatus and Method for Uniform Line of Sight and Non-Line of Sight Coating at High Rate"; Haydn N. G. Wadley;

International Patent Application No. PCT/US2002/28654, filed Sep. 10, 2002, entitled "Method and Apparatus for Application of Metallic Alloy Coatings"; Haydn N. G. Wadley;

U.S. patent application Ser. No. 10/489,090, filed Mar. 9, 2004, entitled "Method and Apparatus Application of Metallic Alloy Coatings"; Haydn N. G. Wadley;

International Patent Application No. PCT/US2002/13639, filed Apr. 30, 2002, entitled "Method and Apparatus for Efficient Application of Substrate Coating"; Haydn N. G. Wadley;

U.S. patent application Ser. No. 10/476,309, filed Oct. 29, 2003, entitled "Method and Apparatus for Efficient Application of Substrate Coating"; Haydn N. G. Wadley;

International Patent Application No. PCT/US2001/16693, filed May 23, 2001, entitled "A Process and Apparatus for Plasma Activated Deposition In Vacuum"; Haydn N. G. Wadley;

U.S. patent application Ser. No. 10/297,347, filed Nov. 21, 2002, entitled "Process and Apparatus for Plasma Activated Deposition in a Vacuum"; Haydn N. G. Wadley; U.S. Pat. No. 7,014,889, issued Mar. 21, 2006.

U.S. patent application Ser. No. 09/634,457, filed Aug. 7, 2000, entitled "Apparatus and Method for Intra-Layer Modulation of the Material Deposition and Assist Beam and the Multilayer Structure Produced Therefrom"; Haydn N. G. Wadley; U.S. Pat. No. 6,478,931, issued Nov. 12, 2002.

U.S. patent application Ser. No. 10/246,018, filed Sep. 18, 2002, entitled "Apparatus and Method for Intra-layer Modulation of the Material Deposition and Assist Beam and the Multilayer Structure Produced Therefrom"; Haydn N. G. Wadley;

International Patent Application No. PCT/US2001/025158, filed Aug. 10, 2001, entitled "Multifunctional Battery And Method Of Making The Same"; Haydn N. G. Wadley;

U.S. patent application Ser. No. 10/110,368, filed Jul. 22, 2002, entitled "Multifunctional Battery and Method of Making the Same"; Haydn N. G. Wadley; U.S. Pat. No. 7,211,348, issued May 1, 2007;

International Patent Application No. PCTUS1999/13450, filed Jun. 15, 1999, entitled "Apparatus And Method For Producing Thermal Barrier Coatings"; Haydn N. G. Wadley;

International Patent Application Publication No. PCT/US1997/11185, filed Jul. 8, 1997, entitled "Production Of Nanometer Particles By Directed Vapor Deposition Of Electron Beam Evaporant"; Haydn N. G. Wadley;

U.S. patent application Ser. No. 08/679,435, filed Jul. 8, 1996, entitled "Production of Nanometer Particles by Directed Vapor Deposition of Electron Beam Evaporant"; Haydn N. G. Wadley; U.S. Pat. No. 5,736,073, issued Apr. 7, 1998;

U.S. patent application Ser. No. 08/298,614, filed Aug. 31, 1994, entitled "Directed Vapor Deposition of Electron Beam Evaporant"; Haydn N. G. Wadley; U.S. Pat. No. 5,534,314, issued Jul. 9, 1996; and U.S. Pat. No. 5,635,087, Schiller, et al., "Apparatus for Plasma-Assisted High Rate Electron Beam Vaporization", issued Jun. 3, 1997.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

We claim:

1. An apparatus for applying at least one coating onto at least one substrate, said apparatus comprising:
    a deposition chamber,
    at least one evaporant source,
    at least one energetic beam for impinging said evaporant source forming a vapor plume,
    at least two hollow cathodes aligned at least substantially coaxially with said at least one evaporant source for delivering a discharge current, and wherein said apparatus is configured wherein said at least one evaporant source is disposed outside said at least two hollow cathodes,
    at least one plasma-forming gas emitted from each of said at least two hollow cathodes,
    at least one anode for electrostatically attracting said discharge current from at least one of said two hollow cathodes, and
    wherein a) said plasma jet at least partially shapes said vapor plume b) said plasma jet at least partially entrains said vapor plume and at least partially assists in transporting said vapor plume to said substrate to provide said at least one coating onto said substrate.

2. The apparatus of claim 1, wherein said at least one evaporant source is a solid.

3. The apparatus of claim 1, wherein said plasma forming gas forms a plasma jet streaming off of an orifice of each of said at least two hollow cathodes.

4. The apparatus of claim 3, wherein the axis and/or momentum of said plasma jet and of said energetic beam are at least substantially aligned with that of each of said at least two hollow cathodes.

5. The apparatus of claim 1, wherein at least some of said vapor plume is ionized by said plasma jet and by said energetic beam.

6. The apparatus of claim 1, further comprising means for initiating said hollow cathode plasma emission.

7. The apparatus of claim 6, wherein said means comprise a heat source based on Ohmic heating of a current conductor, an auxiliary gas discharge, or a kicker circuit to ignite the hollow cathode emission via a high-voltage impulse.

8. The apparatus of claim 1, further comprising at least one cooling device for cooling said at least one evaporant source.

9. The apparatus of claim 8, where said cooling device comprises a crucible.

10. The apparatus of claim 1, wherein said at least two hollow cathodes are positioned in an annular configuration around said at least one evaporant source with the evaporant source at least substantially coaxially integrated inside said annular configuration.

11. The apparatus of claim 10, wherein relative intensity of the plasma jets generated by said at least one of said at least two hollow cathodes may be controlled for directional sweeping either of said plasma jet or vapor plume, or both, from side to side.

12. The apparatus of claim 11, wherein said directional sweeping is accomplished by controlling the pressure or gas flow rate individually in each hollow cathode.

13. The apparatus of claim 10, wherein said annular configuration provides an array.

14. The apparatus of claim 1, wherein said energetic beam is produced by an electron beam gun or a laser source.

15. The apparatus of claim 14, wherein said energetic beam source further comprises means to alter the beam impingement points among one or more evaporation sources.

16. The apparatus of claim 1, further comprising a bias voltage applied to said substrate for accelerating ions toward said substrate.

17. The apparatus claim 16, wherein said bias voltage is a DC, AC or pulsed voltage.

18. The apparatus of claim 1, further comprising an inlet for emitting at least one secondary gas forming at least one jet positioned at least substantially coaxially with said at least one evaporant source and at least one of said at least two hollow cathodes.

19. The apparatus of claim 18, wherein said at least one secondary gas jets at least partially assist in shaping and transporting said vapor plume to said substrate.

20. The apparatus of claim 18, wherein said secondary gas jets introduce reactant gases for creating compounds with the vapor plume.

21. The apparatus of claim 1, wherein said anode is configured in an elevated position above said at least two hollow cathodes.

22. The apparatus of claim 21, wherein said anode is positioned above said substrate.

23. The apparatus of claim 21, wherein said anode is positioned between said substrate and said at least two hollow cathodes.

24. The apparatus of claim 23, wherein said anode is annular.

25. The apparatus of claim 24, wherein said anode further comprises means for creating a magnetic field and for guiding a magnetic flux such that the magnetic field lines in front of the anode are substantially parallel to its surface and radially directed thus forming a closed electrons drift track in circumferential direction which is substantially parallel to the anode's surface.

26. The apparatus of claim 25, wherein said magnetic field facilitates an axial potential gradient for accelerating positive ions toward said substrate.

27. The apparatus of claim 25, wherein said means for creating a magnetic field and for guiding a magnetic flux comprises a magnetic circuit in communication with said anode.

28. The apparatus of claim 1, wherein said anode is annular and positioned at least substantially coaxially and in the same plane as the at least one hollow cathode.

29. The apparatus of claim 28, wherein said anode is bisected radially to form anode segments.

30. The apparatus of claim 29, wherein said anode is bisected into the same number of segments as the number of hollow cathodes and the hollow cathode emissions burn diametrically across the vapor plume between each one of the hollow cathodes and the corresponding anode segment situated at the opposite position.

31. The apparatus of claim 1, further comprising a solenoid positioned coaxially and at least partially proximal to at least one of said at least two hollow cathodes.

32. The apparatus of claim 31, wherein said solenoid is capable of at least partially bending said energetic beam.

33. The apparatus of claim 31, wherein said solenoid is positioned and energized such as to magnetically enhance the at least one of said hollow cathode's efficiency.

34. The apparatus of claim 31, wherein said solenoid at least partially increases plasma density and facilitates an axial potential gradient for accelerating positive ions toward said substrate.

35. The apparatus of claim 1, wherein said at least two hollow cathodes comprises at least one of the following: pipe, conduit, tube, channel, hose, stem, duct, port, groove, passage, tunnel, and port.

36. An apparatus for applying at least one coating onto at least one substrate, said apparatus comprising:
   a deposition chamber,
   at least one evaporant source,
   at least one energetic beam for impinging said evaporant source forming a vapor plume,
   at least one hollow cathode aligned at least substantially coaxially with said at least one evaporant source for delivering a discharge current, and wherein said apparatus is configured wherein said at least one evaporant source is disposed outside said at least one hollow cathode,
   at least one plasma-forming gas emitted from said hollow cathode,
   at least one anode for electrostatically attracting said discharge current from said hollow cathode, and
   wherein said at least one hollow cathode is in an annular configuration comprising two coaxial cylinders of slightly different diameters thus forming an annular slot which facilitates the hollow cathode effect, and
   wherein a) said plasma jet at least partially shapes said vapor plume b) said plasma jet at least partially entrains said vapor plume and at least partially assists in transporting said vapor plume to said substrate to provide said at least one coating onto said substrate.

* * * * *